United States Patent
Niedernostheide et al.

(10) Patent No.: US 6,723,586 B1
(45) Date of Patent: Apr. 20, 2004

(54) THYRISTOR PROVIDED WITH INTEGRATED CIRCUIT-COMMUTATED RECOVERY TIME PROTECTION AND PRODUCTION METHOD THEREFOR

(75) Inventors: Franz Josef Niedernostheide, Münster (DE); Hans-Joachim Schulze, Ottobrunn (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/018,592

(22) PCT Filed: May 19, 2000

(86) PCT No.: PCT/DE00/01609

§ 371 (c)(1),
(2), (4) Date: Apr. 1, 2002

(87) PCT Pub. No.: WO00/75963

PCT Pub. Date: Dec. 14, 2000

(30) Foreign Application Priority Data

Jun. 8, 1999 (DE) .......................... 199 26 104

(51) Int. Cl.$^7$ .......................................... H01L 21/332
(52) U.S. Cl. ........................ 438/133; 438/138; 438/526
(58) Field of Search .................................. 438/133, 134, 438/140, 511, 520, 522, 526, 138; 257/107, 156

(56) References Cited

U.S. PATENT DOCUMENTS

| 4,987,087 | A | * | 1/1991 | Voss ................... 148/DIG. 26 |
| 5,243,205 | A | * | 9/1993 | Kitagawa et al. ........... 257/107 |
| 5,420,045 | A | * | 5/1995 | Schulze et al. ............. 257/173 |
| 5,869,358 | A | | 2/1999 | Galster et al. |
| 6,031,276 | A | * | 2/2000 | Osawa et al. ............... 257/109 |
| 6,274,892 | B1 | * | 8/2001 | Kub et al. .................. 257/131 |
| 6,373,079 | B1 | * | 4/2002 | Ruff et al. .................. 257/111 |

FOREIGN PATENT DOCUMENTS

| DE | 196 50 762 A1 | | 7/1998 |
| EP | 0423721 A2 | * | 4/1991 |
| EP | 651 446 A2 | | 5/1995 |
| EP | 0 767 500 A2 | | 4/1997 |

* cited by examiner

*Primary Examiner*—Tuan H. Nguyen
(74) *Attorney, Agent, or Firm*—Harness, Dickey & Pierce, P.L.C.

(57) ABSTRACT

A thyristor includes a semiconductor body having an anode-side base zone of a first conductance type, and having a cathode-side base zone of the second, opposite conductance type, and has cathode-side and anode-side emitter zones. An anode-side defect zone is included within the anode-side base zone, in which the free charge carriers have a reduced life, with a predetermined thickness of at least 20 μm. The defect zone may be produced by anode-side irradiation of predetermined regions of the semiconductor body with charged particles, and with heat treatment of the semiconductor body in order to stabilize the defect zone.

10 Claims, 1 Drawing Sheet

THYRISTOR PROVIDED WITH INTEGRATED CIRCUIT-COMMUTATED RECOVERY TIME PROTECTION AND PRODUCTION METHOD THEREFOR

This application is the national phase under 35 U.S.C. § 371 of PCT International Application No. PCT/DE00/01609 which has an International filing date of May 19, 2000, which designated the United States of America, the entire contents of which are hereby incorporated by reference.

FIELD OF THE INVENTION

The invention generally relates to thyristors which include a semiconductor body having an anode-side base zone of a first conductance type and having a cathode-side base zone of the second, opposite conductance type, with cathode-side and anode-side emitter zones, and to a method for producing such thyristors.

BACKGROUND OF THE INVENTION

Despite the high power levels which thyristors can handle, they are sensitive, especially when they are connected deliberately or in an unmonitored manner to high voltage. The breakdown triggering which occurs then can lead to destruction of the thyristor. Light-triggerable thyristors are particularly at risk, since the triggering power that is supplied is very low in this case and, in some circumstances, is not sufficient to switch on the thyristor correctly. Improved light-Triggerable high-power thyristors for voltages of up to 8 kV are described by H.-J, Schulze, M. Ruff, B. Baur, H. Kabza, F. Pfirsch, U. Kellner in "Light-triggered 8 kV Thyristors with a New Type of Integrated Breakover Diode" in the Proceedings of the "International Symposium for Semiconductor Power Devices", May (1996).

DE 196 50 762 specifies an improved light-triggerable high-power thyristor with a predetermined carrier life profile and proposes a method for producing such a thyristor, by means of which the breakdown triggering of the thyristor in the thyristor operating temperature range is made largely independent of the temperature. To this end, in a thyristor composed of a semiconductor with an anode-side base zone of a first conductance type and a cathode-side base zone of a second conductance type, with anode-side and cathode-side emitter zones, with a region in the cathode-side base zone which, by virtue of its geometry, has a breakdown voltage which is less than that in the other regions in the cathode-side base zone and in the edge of the semiconductor body, a defect zone in which the life of the free charge carriers is reduced is provided on the anode side underneath the region where the breakdown voltage is reduced. This measure governs the breakover voltage of the thyristor in the forward direction. The position of the minimum in the carrier life profile is used to determine whether the space charge zone, which propagates from the cathode side, does or does not overlap the zone of reduced carrier life when the forward voltages are sufficiently high. An additional generation current is produced if the zones overlap.

However, the thyristors according to the above prior art cannot be loaded again with a surge voltage until after a specific recovery time. Should a voltage surge occur before this time has elapsed, however, then there is a risk of the thyristor being destroyed by the current filamentation that occurs in the cathode surface.

SUMMARY OF THE INVENTION

An object of the present invention is to provide a thyristor with integrated recovery time protection, which may be loaded with a voltage surface once again even within the recovery time without in the process being destroyed by current filamentation occurring in the cathode surface, and to specify a method for producing such a thyristor.

The object is preferably achieved by a thyristor having the features of claim 1, and by a method for producing such a thyristor having the steps in claim 4. Preferred embodiments of the invention are the subject matter of the dependent claims.

The integrated voltage surge protection is achieved, according to the invention, by raising the concentration of free charge carriers in the central region of the component when the thyristor is connected in the blocking direction. The blocking current is thus increased when a blocking voltage load is applied to the thyristor. The increased concentration of free charge carriers is produced by particle irradiation of a zone in the anode-side base of the thyristor. This results in lattice faults in the crystal, which act as recombination and generation centers for charge carriers. This defect zone with a reduced carrier life is in this case arranged in the anode-side base such that, when the thyristor is connected in the blocking direction, it overlaps the space charge zone propagating from the anode side, and the minimum carrier life in the component occurs underneath the emitter. In the forward direction (in the blocking region) of the thyristor, the defect zone with the reduced carrier life is, in contrast, located inside the neutral anode-side base. This means that the blocking current in the forward direction (leakage current) is not increased. The defect zone extends over an area in the thyristor which depends on the desired reduction in the carrier life in the defect zone.

The thyristor according to the invention, which includes a semiconductor body having an anode-side base zone of a first conductance type and having a cathode-side base zone of the second, opposite conductance type, having cathode-side and having anode-side emitter zones, where a defect zone is arranged within the anode-side base zone on the anode side, in which the free charge carriers have a reduced life, with a predetermined thickness of at least 20 $\mu$m.

The defect zone preferably essentially has defects in the crystal lattice, which are produced by irradiation with high-energy particles. In general, the thickness of the defect zone can be selected as a function of the generation current, such that the desired generation current is produced.

In order to produce a thyristor according to the invention, the semiconductor is irradiated such that this results in a region with reduced charge carrier life within the base of the thyristor. The production method for a thyristor is characterized in that, in order to produce the defect zone, anode-side irradiation of predetermined regions of the semiconductor body with charged particles is carried out, followed by heat-treatment of the semiconductor body in order to stabilize the defect zone.

Protons or $\alpha$-particles are preferably used for irradiation of the predetermined regions. A dose of approximately $5 \cdot 10^9$ to $10^{12}$ cm$^{-2}$ for $\alpha$-particles and from $10^{11}$ to $10^{13}$ cm$^{-2}$ for protons is selected for irradiation of the predetermined regions.

BRIEF DESCRIPTION OF THE DRAWINGS

Further features and advantages of the invention can be found in the following description of embodiments, and with reference to the attached drawings, in which.

DETAILED DESCRIPTION OF THE PREFERRED EMBODIMENTS

Figure 1:
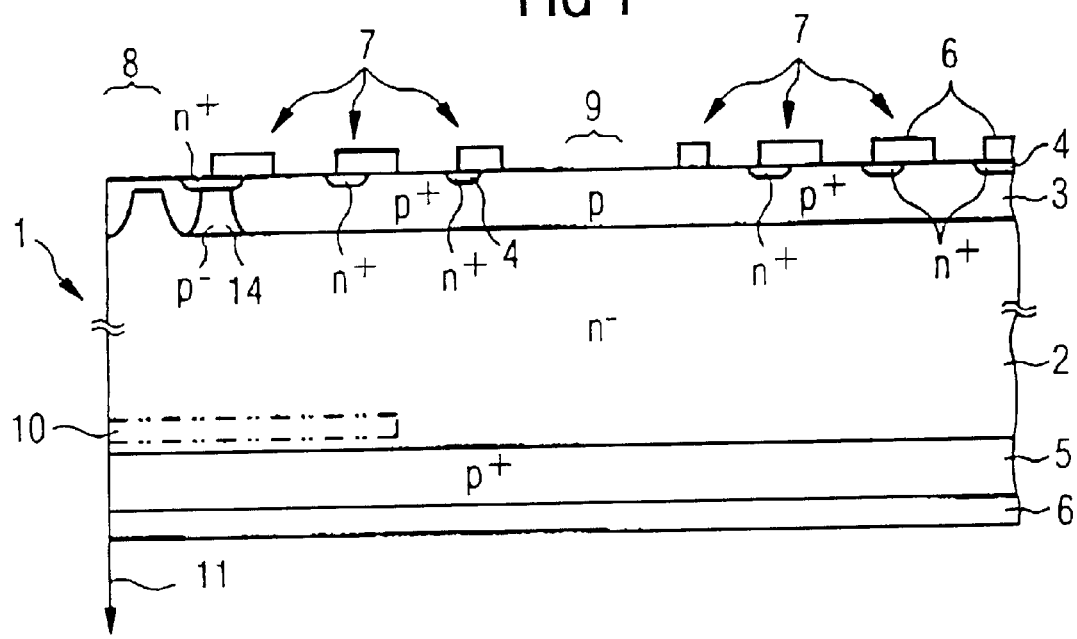
FIG. 1 shows a cross section of a thyristor having a defect zone arranged according to the invention.

A cross section of the central region of a thyristor with integrated light triggering and breakdown triggering and with an amplifying gate structure with an integrated resistance for current limiting is illustrated in FIG. 1. The thyristor includes a semiconductor body 1, which has an anode-side base zone 2 of a first conductance type and a cathode-side base zone 3 of the second, opposite conductance type. The respective base zones 2 and 3 are connected to a respective cathode-side and anode-side emitter zone 4 or 5 on the two opposite surfaces of the semiconductor body 1.

Metallization 6 is provided on each of the emitter zones 4 and 5.

The thyristor illustrated in FIG. 1 is preferably a light-triggerable thyristor with a number of amplifying gate (AG) stages 7. Each AG stage 7 includes a dedicated cathode-side emitter zone 4 with the corresponding metallization 6, which is arranged on one surface of the semiconductor body 1, opposite the common, anode-side emitter zone 5. Furthermore a p⁻ zone 14 is integrated in the thyristor, for protection against an excessively high dU/dt load. The integrated p⁻ zone 14 means that the triggering in the event of a voltage surge takes place first of all in the innermost AG stage 7 of the thyristor.

The triggering voltage ("breakdown triggering voltage") on triggering of the thyristor by means of a high blocking voltage is defined by the integrated breakover diode (BOD) 8. This has an accurately defined profile for the boundary surface between the cathode-side base 3 and the anode-side base 2, which leads to a rise in the maximum electrical field in that region and thus to a reduction in the blocking voltage of the thyristor.

In order to reduce the load on the above structure during the switching-on phase, the thyristor shown in FIG. 1 may also be provided with a transverse current limiting resistance 9 which, as a resistance, limits the current flowing outward from the center of the thyristor in the cathode-side base 3. The resistance 9 in this case encloses the first AG stages 7, as seen from the center of the thyristor, and is produced, for example, by way of a weaker dopant concentration.

In order to allow the thyristor to be loaded with a surge voltage within the recovery time, without the thyristor being destroyed in the process, the triggering which is initiated by the voltage surge within the recovery time must take place first of all in the central region of the light-triggerable thyristors. This triggering takes place within the inner AG stages 7. The deliberate displacement of the triggering from the cathode surface into the central region of the AG stages 7 means that the triggering front which follows the voltage surge can propagate very quickly, so that current filamentation is avoided. However, special measures are required to do this, since, generally, triggering in the event of a voltage surge within the recovery time does not take place in this central region because there are no free charge carriers, or relatively few free charge carriers, to assist the triggering process in this region—in contrast to the cathode surface—at this time. This is because the inner AG stages 7 are switched off again considerably earlier than the cathode surface.

In the thyristor according to the invention, the blocking current in the central region of the component is deliberately increased, by means of a vertically inhomogeneous setting of the carrier life, when a voltage load in the blocking direction occurs on the thyristor. This increase in the blocking current leads to an increase in the concentration of free charge carriers in the central region of the component, as is desirable to provide the integrated recovery protection.

In order to raise the free charge carrier concentration as effectively as possible, the vertical carrier life profile is set such that the minimum carrier life is located tightly underneath the p⁺ emitter 5 of the thyristor. Firstly, this increase of the blocking current in the blocking direction while, secondly, the blocking current in the forward direction (breakover direction) is left unchanged, if the minimum carrier life in the event of a voltage load in the forward direction is located in the region of the neutral zone of the n-base 2, and thus does not cause any additional leakage current. Thus, on the anode side, the thyristor according to the invention includes a defect zone 10 in which the free charge carrier within the base 2 have a reduced life. The defect zone 10 with a short carrier life is represented as a region shown by dashed lines in FIG. 1. As shown in FIG. 1, it can maintain a predetermined distance from the emitter zone 5 of the thyristor, but it is normally produced immediately adjacent to the emitter zone 5 in the base zone 2.

The effect of the defect zone 10 is based on crystal lattice defects, which occur due to irradiation of the crystal with particles, with the particles having relatively high energy. The dimensions of the defect zone 10 are governed by the requirement for additional free charge carriers and the condition, explained above, that triggering must take place within the inner AG stages 7. A further parameter governing the dimension of the defect zone 10 is the magnitude of the life reduction in the defect zone 10. It has been found that the thickness of the zone 10 should be at least 20 μm, and the lateral extent of the zone 10 should be approximately 2 mm. In general, the thickness of the defect zone 10 is selected as a function of the desired generation current.

In order to reduce the lateral extent further, a thickness of 50 μm may be selected for the defect zone 10.

Figure 2A:
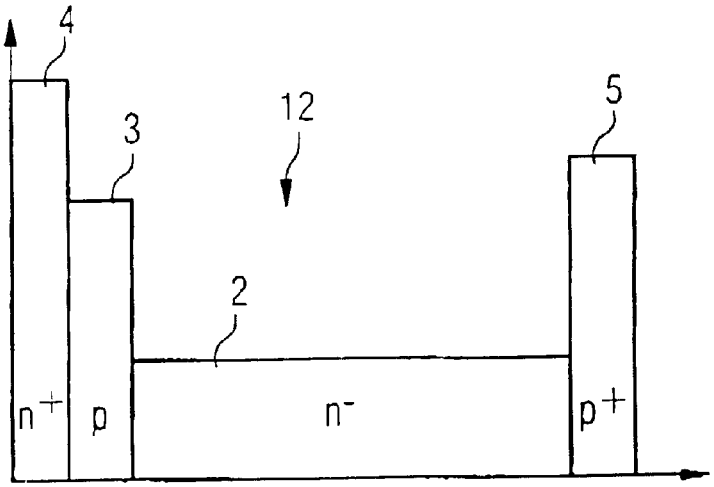
FIGS. 2A and 2B show, schematically, the form of the doping profile of an amplifying gate stage, and the carrier life profile of the thyristor shown in FIG. 1.
Figure 2B:
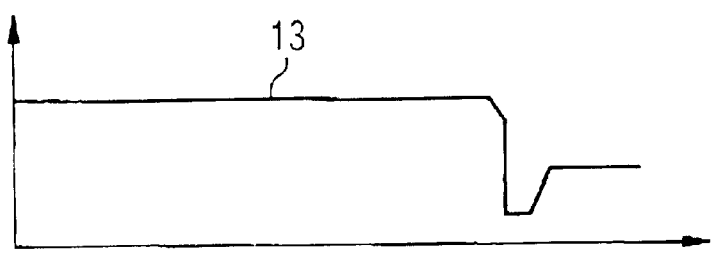

FIGS. 2A and 2B show the doping profile 12 and, respectively, the distribution of the charge carrier life 13 in the thyristor constructed as shown in FIG. 1. In this case, the doping concentration is plotted on the vertical axis in FIG. 2A, and the life of the charge carriers is plotted on the vertical axis in FIG. 2B. The horizontal axis in each case represents the component axis 11 at right angles to one surface of the semiconductor in FIG. 1. In this case, the horizontal axis in FIGS. 2A and 2B points from top to bottom in FIG. 1.

FIG. 2A shows, schematically, the form of the doping profile on an AG stage 7 of the thyristor shown in FIG. 1. The doping regions have the same respective reference symbols as in FIG. 1, and the form of the doping profile 12 is described from left to right in FIG. 2, in the following text. The cathode-side emitter 4 has n⁺ doping while the adjacent cathode-side base 3 is p doped, the (broader) anode-side base 2 is n⁺ doped, and the anode-side emitter 5 is p⁺ doped. It can be seen from FIG. 2A that the thyristor according to the invention substantially has the same doping profile as a conventional thyristor.

FIG. 2B shows, schematically, the carrier life profile 13 for the thyristor according to the invention as shown in FIG. 1. As described with reference to FIG. 1, the anode-side base zone 2 has an inhomogeneous density distribution of recombination and generation centers for free charge carriers in the vertical direction, that is to say in the direction at right angles to a surface of the component. The density of the recombination and generation centers reaches its maximum in the region 10 surrounded by a dashed line in FIG. 1. This is where the charge carrier life is shortest, and the carrier life profile 13 has a minimum.

The production method according to the invention for a thyristor as shown in FIG. 1 with the doping profile and the charge carrier life as shown in FIG. 2 includes the steps described in the following text, in addition to the conventional steps, which are known to those skilled in the art, for producing the defect zone 10.

After completion of a thyristor with the doping profile 12 as shown in FIG. 2A, this thyristor is irradiated with charged particles on the anode side in predetermined regions of the semiconductor body 1. Protons or α-particles having a predetermined energy are preferably used for the irradiation. The dose of irradiation for the predetermined regions is, for example, approximately between $5 \cdot 10^9$ and $10^{12}$ cm$^{-2}$ for α-particles and between $10^{11}$ and $10^{13}$ cm$^{-2}$ for protons. This depends on the extent to which it is intended to reduce the carrier life in the defect zone 10. The particle irradiation results in the production of silicon defects, and thus in a reduction in the generation life. This in turn results in an increase in the leakage current. Like double blanks or A-centers, for example, the silicon defects in this case occur primarily in a zone in which the particles have already lost the majority of their energy; that is to say at a depth which is somewhat less than the penetration depth of the irradiation particles. The extent of the increase in the blocking current can be determined by means of the irradiation energy, by selecting the irradiation dose and the distance between the silicon surface and the zone which is rich in defects and is produced by the irradiation.

The irradiation area and the width of the energy distribution of the charged particles for the irradiation depend on the desired dimensions of the defect zone 10. The mean energy of the irradiation particles depends on the depth at which the defect zone 10 is intended to be arranged. This is of major importance, since the effect of the thyristor according to the invention is governed by the overlap of the zone of reduced carrier life and the space charge zone propagating from the anode side. If necessary, it may be necessary to carry out a number of irradiation processes with different energy levels in order to produce the desired width for the defect zone 10. The lateral extent of the defect zone 10 can be set by covering the regions outside the defect zone 10 by a mask during the irradiation of the thyristor in order to bound the defect zone 10 laterally, and/or by using a beam deflection unit for deflecting and/or focusing an ion beam onto the defect zone 10.

Heat treatment is carried out after the particle irradiation in order to stabilize the crystal lattice defects, so that fluctuations with reference to the electrical data of the component during operation are avoided. The healing process is preferably carried out at a temperature of approximately 250° C. when silicon is used as the semiconductor.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A thyristor comprising:

a semiconductor body having an anode-side base zone of a first conductance type, a cathode-side base zone of a second opposite conductance type, and cathode-side and anode-side emitter zones, wherein a defect zone is arranged only within the anode-side base zone on the anode-side and is directly adjacent the emitter zone, in which free charge carriers have a reduced life, and wherein the defect zone has a predetermined thickness of at least 20 μm, and has a length being less than a length of the thyristor.

2. The thyristor as claimed in claim 1, wherein a defect zone includes defects in a crystal lattice thereof.

3. The thyristor as claimed in claim 2, wherein the predetermined thickness of the defect zone is selected as a function of a desired generation current.

4. The thyristor as claimed in claim 1, wherein the predetermined thickness of the defect zone is selected as a function of a desired generation current.

5. A production method for a thyristor, comprising the steps of:

producing a semiconductor body having at least an anode-side base zone;

producing a defect zone only in the anode-side base zone, the defect zone being shorter in length than a length of the thyristor and being directly adjacent an anode-side emitter zone;

irradiating predetermined regions of the semiconductor body with charged particles; and heat-treating the semiconductor body in order to stabilize the defect zone.

6. The production method as claimed in claim 5, wherein protons or a-particles with a predetermined energy are used to irradiate the predetermined regions.

7. The production method as claimed in claim 6, wherein a dose of approximately $5 \cdot 10^9$ to $10^{12}$ cm$^{-2}$ for α-particles and from $10^{11}$ to $10^{13}$ cm$^{-2}$ for protons is selected for irradiation of the predetermined regions.

8. The production method as claimed in claim 5, further comprising the step of:

masking regions outside the defect zone in order to bound the defect zone during the irradiating step.

9. The production method as claimed in claim 5, further comprising the step of:

deflecting an ion beam produced during the irradiating step onto the defect zone.

10. The production method as claimed in claim 5, further comprising the step of:

focusing an ion beam produced during the irradiating step onto the defect zone.

* * * * *